United States Patent [19]

Watts

[11] 4,041,400
[45] Aug. 9, 1977

[54] TELEVISION REMOTE CONTROL SYSTEM

[75] Inventor: Gary P. Watts, Schaumburg, Ill.

[73] Assignee: Sperry Electronics Ltd., Melrose Park, Ill.

[21] Appl. No.: 660,648

[22] Filed: Feb. 23, 1976

[51] Int. Cl.² .............................................. H04B 1/16
[52] U.S. Cl. ................................... 325/392; 325/461; 358/194
[58] Field of Search ................................ 325/390–392, 325/461, 37; 178/DIG. 15; 343/225, 228; 340/147 C, 147 F, 171 A

[56] References Cited

U.S. PATENT DOCUMENTS

| 3,801,915 | 4/1974 | Ostuni et al. | 325/461 |
| 3,806,843 | 4/1974 | Arrington et al. | 325/392 |
| 3,854,123 | 12/1974 | Banach | 178/DIG. 15 |

Primary Examiner—Robert L. Griffin
Assistant Examiner—Marc E. Bookbinder
Attorney, Agent, or Firm—Dominik, Knechtel, Godula & Demeur

[57] ABSTRACT

A T.V. remote control system includes a wireless hand control and a control unit easily and quickly coupled to any television. The control unit contains a varactor tunable frequency converter to convert selected signals to an unused channel responsive to the application of respective tuning voltages. Channel sequencing is possible directly or by remote control in addition to skipping of unused channels.

10 Claims, 10 Drawing Figures

FIG.5 SEQUENCING CIRCUIT 22

TELEVISION REMOTE CONTROL SYSTEM

BACKGROUND OF THE INVENTION

This invention relates to a remote control system for remotely controlling the channel selection on a television. More particularly, it relates to a remote control system which can be retro-fitted to any television, and which requires no internal connection or wire connections between a hand-held remote control and the television.

Many televisions have incorporate therewith a remote control system for controlling the channel selection and other functions of the television set from a remote location. These remote control systems are an integral part of the television and cannot be removed for installation in another set. There are also presently available remote control systems which can be retro-fitted to a television, however, most of these are generally unsatisfactory or undesirable, for they require internal connections and/or the installation of a mechanical linkage for physically rotating the channel selector knob, generally as it would be manually manipulated, or wire connections between the hand-held control and the television.

The remote control system of the present invention, on the other hand, can be easily and quickly retro-fitted to any television, without the need of any special tools, and without the need of any internal connections, mechanical linkages or the like, and controls the VHF channel selection and the on/off functions of the television set, whether black and white or color. The remote control system, furthermore, includes a control unit which is connected to the television, and a wireless hand control or transmitter, for operating the control unit, hence, no wires are required between the transmitter and the television.

To install the remote control system the control unit is simply plugged into any electrical outlet; the antenna lead-in wires, normally connected to the television, are connected, instead, to the control unit; the television's power cord is plugged into the control unit; and then the output of the control unit is connected to the antenna terminals of the television. Accordingly, it is apparent that installation is easily and quickly accomplished.

To operate the remote control system and the television, the television first is tuned to an unused channel, such as channel 2 or channel 3, its power switch is operated to the ON position, and both are left in these positions. Thereafter, by simply pressing a button on the wireless hand control, the television is turned ON and a channel is selected, or the channel can be instantly changed. A channel selection button also is provided on the control unit to permit the control unit to be manually operated by pushing the button, to select a channel, or to turn the television OFF or ON. The remote control system also can be programmed to automatically skip unused channels.

The push button switch on the wireless hand control is momentarily operated to change channels. However, if the push button switch is continuously operated, the operation is such that the tuner will sequence through each channel until the push button switch is released. During sequencing, a time delay is provided so there will be a one-second pause on each channel.

Accordingly, it is an object of the present invention to provide an improved remote control system for remotely controlling the VHF channel selection and the on/off functions of a television.

More particularly, it is an object to provide such a remote control system which can be easily and quickly retro-fitted to any television set, whether black and white or color.

More particularly still, it is an object of the present invention to provide an improved remote control system of the above type which can be retro-fitted to any television, without the need of special tools and without any internal connections.

SUMMARY OF THE INVENTION

Generally, the remote control system of the present invention includes a wireless hand control and a control unit which is easily and quickly retro-fitted to any television. Installation is accomplished simply by plugging the television's power cord into the control unit, by attaching the television antenna lead-in wires to the control unit, by connecting the output of the control unit to the television's antenna input terminals, and by plugging the control unit into any electrical outlet. Thereafter, the television's power switch is turned ON, and the television's tuner is tuned to an unused channel, such as channel 2 or channel 3. The remote control system now is ready for use.

The control unit of the remote control system includes a solid-state varactor tuner that is operable to select a channel based on the level of tuning voltages coupled to it. The tuner, furthermore, converts the frequency of the selected channel to the same frequency of the unused channel. This converted frequency is coupled to the input terminals of the television and, hence, to the tuner integrally built into the television. The control unit also includes a resistor array for selectively providing the tuning voltages to the varactor tuner, to tune in channels 2 through 13. Thus, channel change is done electronically, with no need to mechanically move the television tuner.

A sequencing circuit is provided in the control unit to automatically step through each of the channels. The sequencing circuit can be manually operated to step from one to the next channel, or it can be remotely operated by the wireless hand-held transmitter. Program switches are provided to automatically skip unused channels. One sequence position is designated as the OFF position and, in this position, an isolated solid-state switch is enabled that will disconnect the power from the television. Once the sequence circuit is triggered again, the television is turned back ON and goes to the first programmed channel. The control unit further includes a channel display which is a large electronic digital display of the channel in use.

The wireless hand control has a push button to activate the control unit. If the push button is momentarily operated, the sequencing circuit is operated to step to the next programmed channel. However, if the push button is operated continuously, the tuner will be sequenced through each channel until the push button is released. There is a time delay provided, so there will be a one-second pause on each channel.

BRIEF DESCRIPTION OF THE DRAWINGS

The features of this invention which are believed to be novel are set forth with particularity in the appended claims. The invention, together with further features and advantages thereof, may be best understood, however, by reference to the following description taken in conjunction with the accompanying drawings, in the figures of which the numerals identify like elements and in which:

FIG. 8 illustrates the manner in which FIGS. 4A, 4B, 4C, 5-7 are assembled.

DETAILED DESCRIPTION OF THE PREFERRED EMBODIMENT

Figure 1:
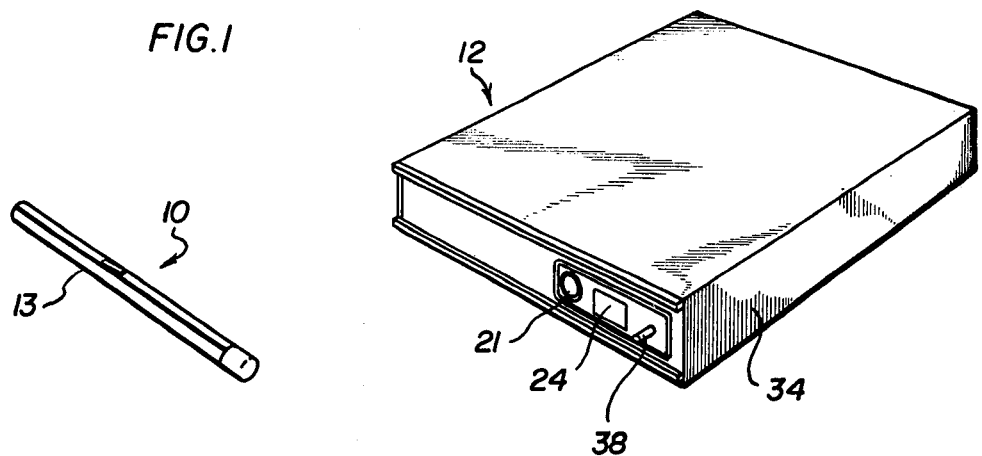
FIG. 1 is a perspective view generally illustrating the control unit and the wireless hand-held control of the remote control system of the invention.
Figure 2:
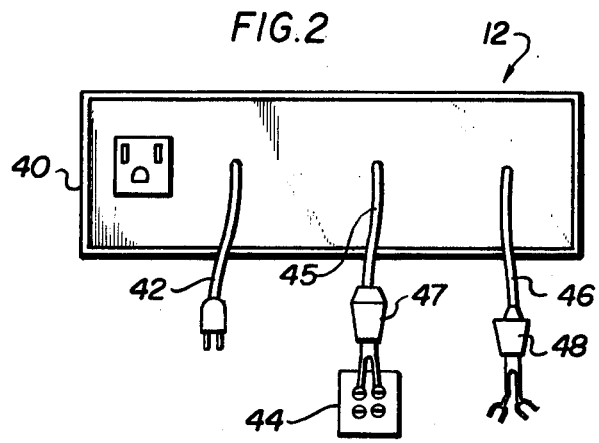
FIG. 2 is a rear view of the control unit.
Figure 3:
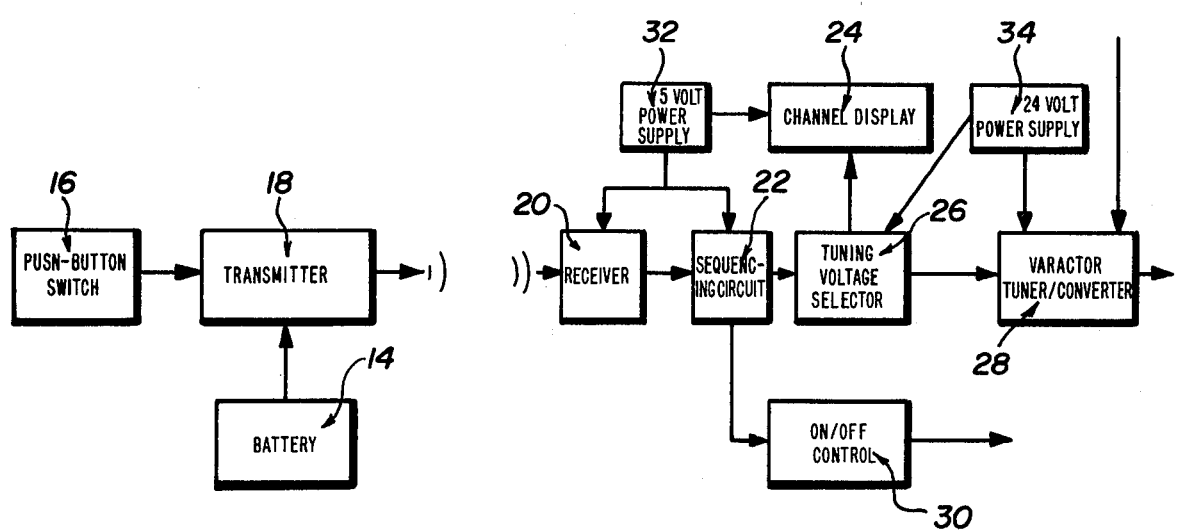
FIG. 3 is a block diagram schematic of the remote control system of the present invention.
Figure 4:
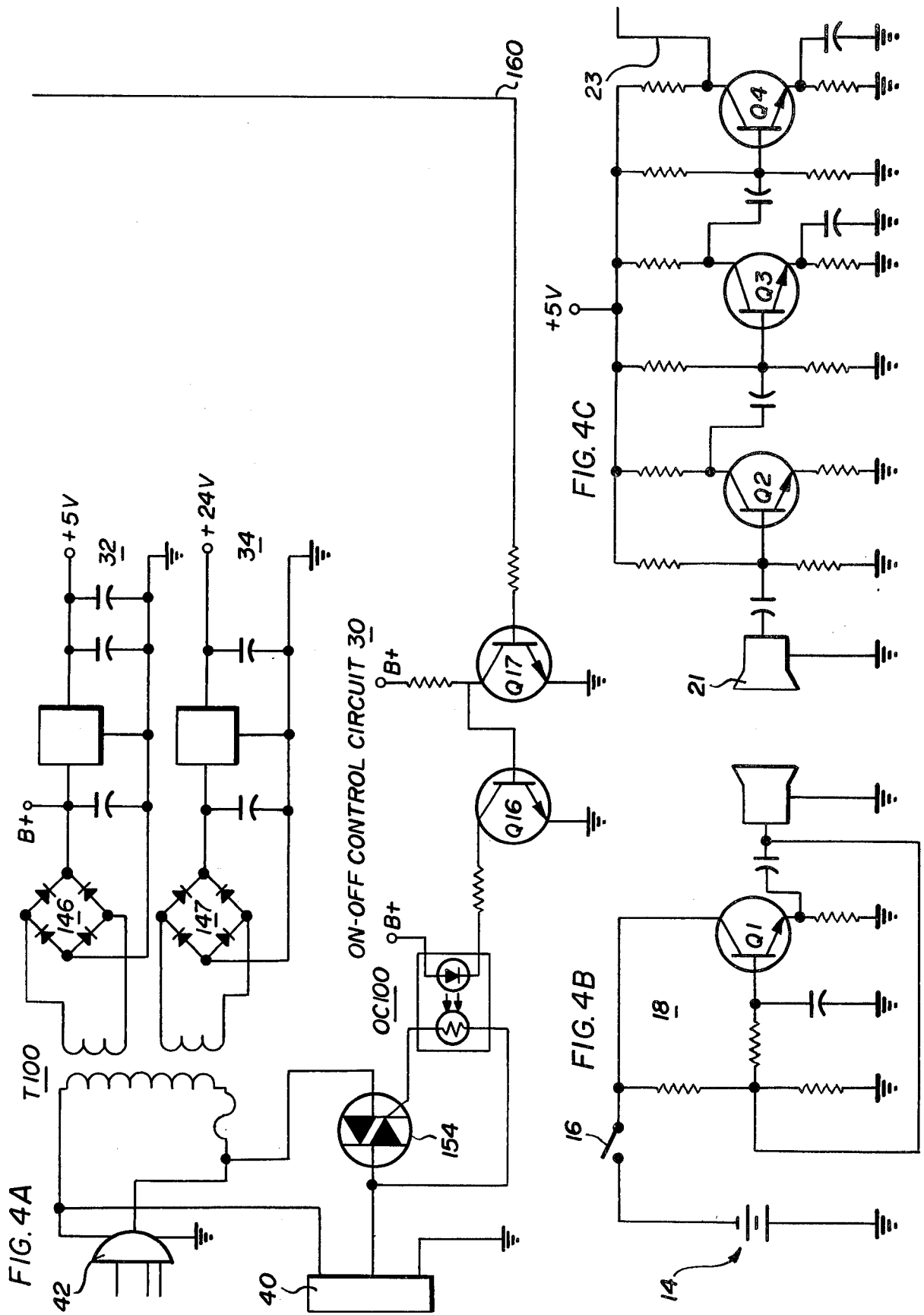
FIGS. 4A, 4B, 4C, 5-7, when assembled as illustrated in FIG. 8, comprise an electrical schematic of the remote control system of the invention.

Referring now to the drawings, in FIGS. 1 and 2, it can be seen that the remote control system of the present invention includes as its principal components a wireless hand control 10 and a control unit 12. The hand control 10, in the illustrated embodiment, has an enclosure 13 which is in the shape of a wand, however, the enclosure can be any one of a number of other different configurations. As can be seen in FIGS. 3 and 4, the hand control 10 includes a 9-volt DC battery 14, a push button switch 16 and a transmitter 18.

The control unit 12, as can be seen in FIGS. 3-7, generally includes a receiver 20, a sequencing circuit 22, a channel display 24, a tuning voltage selector circuit 26, a varactor tuner/converter 28, and on/off control circuit 30, and a 5 volt power supply 32 and a 24 volt power supply 34 for energizing the various components of the control unit, all of which are more fully described below. The control unit 12 includes a housing or enclosure 34 for containing these above-mentioned circuits and components, and the enclosure has a decorative front panel which features the channel display 24 which is a large electronic digital channel display, together with the transducer 21 of the receiver 20 of the control unit, and a channel selector push button 38 which can be manually operated to activate the control unit to change channels.

On the back panel of the control unit 12, as can be seen in FIG. 2, there is provided a receptacle 40 for receiving the power cord of the television to which the remote control system is to be retro-fitted, a power cord 42 which is adapted to be plugged into any standard electrical outlet to energize the control unit, input antenna connector 44 to which the antenna wires, such as the antenna wires 45, which are normally connected to the VHF antenna input terminals on the television are connected, and an output cable 46 which is connected to the VHF antenna input terminals on the television.

To retro-fit the remote control system of the present invention to any television, the power cord for the television is plugged into the receptacle 40 provided on the back of the control unit 12, and the power cord 42 for the control unit 12 is plugged into any convenient conventional electrical outlet. The antenna wires, such as the antenna wires 45, which are normally connected to the VHF antenna input of the television are, instead, now coupled to the input terminals 44 on the back of the control unit 12, and the output cable 46 of the control unit 12 is connected to the VHF antenna inputs of the television. In the event that the television antenna system uses 300 ohm twin led, matching transformers, such as the matching transformers 47 and 48, preferably and advantageously are used to match the 75 ohm input of the control unit. When connected in this fashion, the remote control system of the present invention is ready for use. Accordingly, it can be seen that the remote control system can be retro-fitted to any television, without special tools and without any internal connections, in only a few minutes time.

In FIGS. 4-7, the electrical schematic of a remote control system exemplary of the present invention is illustrated. While a preferred arrangement is illustrated, it will be appreciated that various changes can be made without departing from the scope of the invention. For example, a commercially available varactor tuner, which not only is operable to tune in the different channels, but is further operable to convert the frequency of the tuned channel to the frequency of an unused channel is illustrated and described. A conventional varactor tuner and a separate frequency converter circuit could be used.

Wireless Hand Control 10 (FIG. 4B)

The wireless hand control 10 is illustrated in FIG. 4B and, as indicated above, includes an enclosure 13 for containing a transmitter 18, a 9-volt DC battery 14 for energizing the transmitter 18, and a push button switch 16 for coupling the 9-volt DC battery to the transmitter for energizing it to produce an output signal. The transmitter 18 can be a conventional solid-state transmitter which is operable to provide a sonic output signal. In the illustrated embodiment, the transmitter 18 provides a 40 KHz sonic output signal. To operate the transmitter 18, the push button switch 16 is closed, thus coupling the 9-volt DC battery 14 to the transistor Q1 to bias it conductive to transmit the 40 KHz sonic signal.

Control Unit 12 (FIGS. 4A, 4C, 5-7)

The control unit 12 is illustrated in FIGS. 4-7 and, as indicated above, it generally includes a receiver 20, a sequencing circuit 22, a channel display 24, a tuning voltage selector circuit 26, a varactor tuner/converter 28, an on/off control circuit 30, a 5-volt power supply 32 and a 24-volt power supply 34. Each of these various circuits are more particularly described below.

Receiver 20 (FIG. 4C)

The receiver 20, like the transmitter 18, can be of a conventional design including a transducer 21 for receiving the sonic signals transmitted by the transmitter 18. In the illustrated embodiment, three stages of amplification are provided by the transistor amplifiers, including the transistors Q2, Q3 and Q4, respectively. The amplified signals are coupled through a capacitor C1 to the input of a tone decoder 50 of the sequencing circuit 22.

Figure 5:
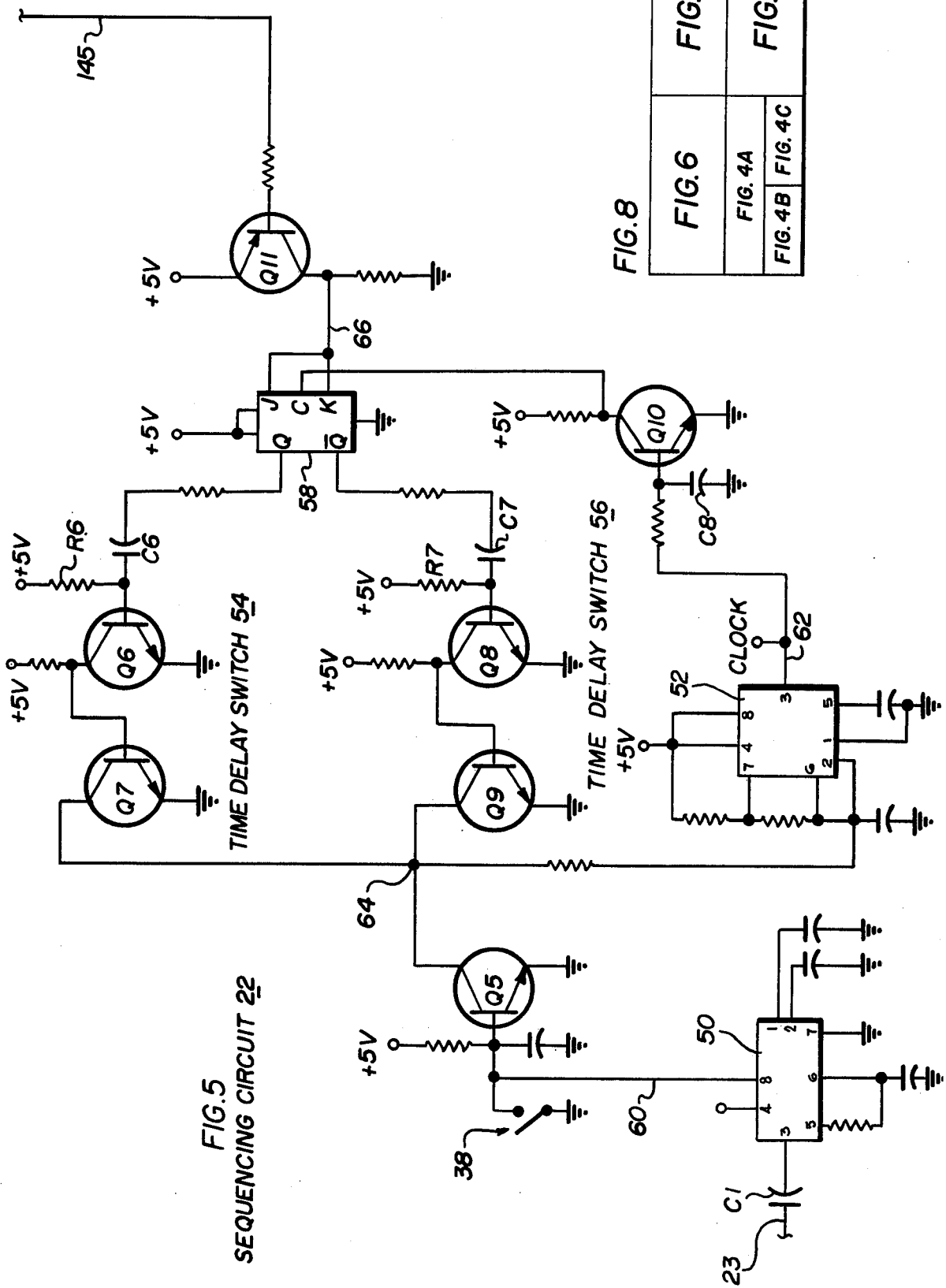

Sequencing Circuit 22 (FIG. 5)

The sequencing circuit 22 generally includes a tone decoder 50; a transistor switch Q5; a timer 52; a pair of time delay transistor switches 54 and 56 which include transistors Q6 and Q7 and a RC time constant network comprising the resistor R6 and capacitor C6, and transistors Q8 and Q9 and an RC time constant network comprising the resistor R7 and capacitor C7, respectively; a transistor switch Q10; a flip-flop 58; and a transistor switch Q11. The function of the sequencing circuit 22 generally is to detect the transmission of the sonic signal by the transmitter 18 and to initiate and control the operation of the remote control system in changing from one channel to the next, as more particularly described below.

The tone decoder 50, in the illustrated embodiment, detects and is responsive to the 40 KHz sonic signal which is transmitted by the transmitter 18 and which is received and amplified by the receiver 20. The tone decoder 50 may be a type 567 tone decoder manufactured and sold by Signetics, or its equivalent. The tone decoeder 50, in response to the receipt of a 40 KHz signal, produces an output signal on the lead 60 to ground the base electrode of the transistor switch Q5 to turn the transistor Q5 OFF, to initiate the sequencing operation to tune the television, or to turn the television ON or OFF, as described more fully below.

It may be noted that the channel selector push button 38 also is coupled with and arranged to couple around to the base of the transistor switch Q5 to turn it OFF, so that the sequencing operation can be manually initiated by closing the channel selector push button 38.

The timer 50 is operative to produce clock pulse on its output lead 62, which output clock pulses are coupled to the transistor switch Q10 and to a decade counter 70 of the channel display 24. The timer 50, in the illustrated embodiment, produces clock pulses at the rate of approximately 100 cycles per second and may be, for example, a type 555 timer manufactured and sold by Signetics, or its equivalent. The operation of the timer 50 is controlled by the transistor switch Q5 and the two time delay transistor switches 54 and 56, the outputs of which all are coupled to a common junction 64 which is coupled to the timer 50.

The time delay transistor switches 54 and 56 are coupled to the Q and $\bar{Q}$ outputs of the flip-flop 58. The transistors Q6 and Q8 of these switches normally are ON, while the transistors Q7 and Q9 are OFF. When the flip-flop 58 is operated and its Q output, for example, goes low, the transistor Q6 immediately turns OFF and the transistor Q7 turns ON, thus coupling ground to the junction 64, and hence, to the timer 52, stopping the timer 52, as more particularly described below. The RC time constant network including the resistor R6 and the capacitor C6 provides a delay of approximately one second, before transistor Q6 again is turned ON and the transistor Q7 is turned OFF, thus removing ground at the junction 64. With this ground removed, the timer 52 again is permitted to run, producing clock pulses on its output lead 62. The time delay transistor switch 56 operates in a similar fashion, when the $\bar{Q}$ output of the flip-flop 58 goes low. The time delay transistor switches 54 and 56 provide a one second pause on each channel during the sequencing operation, and the two of them are provided to permit the capacitors C6 and C7 of the RC time constant networks to charge and to discharge, in the event the transmitter 18 is continuously operated, to provide the one second pause, all as more fully described below.

The flip-flop 58, as indicated above, controls the operation of the time delay transistor switches 54 and 56 and it is, in turn, controlled by the transistor switches Q10 and Q11. The flip-flop 58 may be, for example, one-half of a type 7473 JK flip-flop manufactured and sold by Signetics, or its equivalent.

The transistor switch Q10 is coupled to the CLOCK input of the flip-flop 58, and the transistor switch Q11 is coupled to both the J and K inputs of the flip-flop 58. Normally, one or the other of the Q and $\bar{Q}$ outputs is high, and the other is low. When the transistor switch Q11 is turned ON, the signal on the lead 66 to the J and K inputs of the flip-flop 58 goes high. Now, when the transistor switch Q10 operates to clock the flip-flop 58, the signals at the Q and $\bar{Q}$ outputs are reversed.

The transistor switch Q11 is normally OFF, and is turned ON when a channel is selected. Accordingly, the flip-flop 58 is operated by the transistor switch Q11, each time a channel is selected. The transistor switch Q10 is operated by the clock pulses of the timer 52, with its operation being delayed by capacitor C8. This time delay is sufficient to permit a channel to be selected and the transistor switch Q11 to be operated, before the transistor switch Q10 can operate to clock the flip-flop 58.

Figure 6:
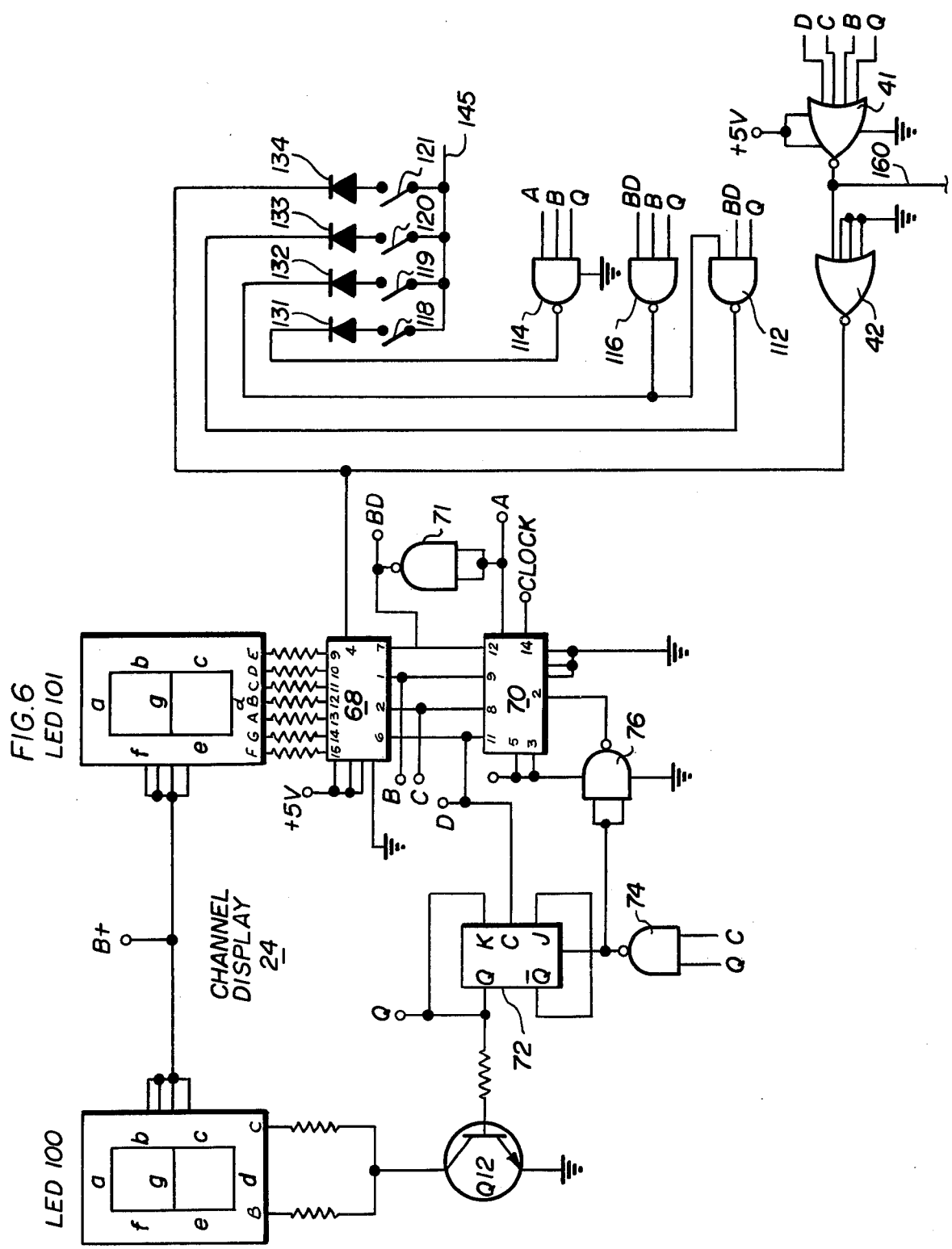

Channel Display 24 (FIG. 6)

The channel display 24, as can be seen in FIG. 6, includes two conventional, commercially available seven segment readout devices LED 100 and LED 101, a decoder/driver 68, a decade counter 70, a transistor driver Q12, a flip-flop 72, and a pari of NAND gates 74 and 76.

The decade counter 70 may be a type 7,490 decade counter manufactured and sold by Signetics, or its equivalent connected to operate as a binary coded decimal counter, in response to the clock pulse generated by the timer 52 of the sequencing circuit 22. In this respect, it may be noted that the A output of the decade counter 70 is coupled through a NAND gate 71 to the BD input of the decade counter 70. With this arrangement, i.e., with the A output being inverted by the NAND gate 71 and coupled to the BD input of the decode counter 70, its BCD count output actually is advanced by one count. Accordingly, upon the count of one, the BCD count output actually corresponds to the count of 2, and so on.

The decade counter 70 drives the decoder/driver 68 which, in turn, drives the seven segment digital readout LED 101. The decoder/driver 68 is a seven segment decoder/driver and may be, for example, a type 7447 decoder/driver of the type manufactured by Signetics, or its equivalent. It may be noted that the BD output which corresponds to the inverted A output of the decode counter 70 is coupled to and used to drive the decoder/driver 68, so that its decoded count also corresponds to the advanced count of the decode counter 70.

The digital readout LED 100 is driven by the transistor driver Q12, under the control of the flip-flop 72, with the latter, in turn, being controlled by the decoder counter 70. The flip-flop 72 may be one-half of a type 7473 JK flip-flop manufactured and sold by Signetics, or its equivalent, with its Q output coupled to its K input and its $\bar{Q}$ output coupled to its J input. The D output of the decade counter 70 is coupled to the clock input of the flip-flop 72, and the output of the NAND gate 74 is coupled to its clear input. The output of the NAND gate 74 also is coupled to the NAND gate 76, and the latter's output is coupled to the reset input of the decade counter 70. The NAND gate 74 is enabled when both the Q output of the flip-flop 72 and the C output of the decode counter 70 are high, to reset both the flip-flop 72 and the decade counter 70.

In operation, the clock pulses generated by the timer 50 of the sequencing circuit 22 are coupled to the decade counter 70 to operate it. Assume that initially the television is OFF and that the timer 50 is enabled to generate clock pulses, as a result of the hand control 10 or the channel selector push button 38 being operated. Upon receipt of the first clock pulse, the decade counter 70 is operated and a BCD count corresponding to a BCD count of 2 is coupled to the decoder/driver 68, for the reasons explained above. The decoder/driver 68 decodes this BCD count and drives the digital readout LED to cause it to display the numeral 2, in a conventional fashion.

As additional clock pulses are received, the count of the decade counter 70 progresses, with each count corresponding to count advanced by one, and the corresponding numerals are displayed by the LED 101. On the count of 9, the BCD count corresponds to the count of 0, so that the D output now goes low, thus clocking the flip-flop 72 and its Q output goes high.

At this time, all of the inputs to the decoder/driver 68 are low, and the digital readout LED 101 is driven to display the numeral 0. Also, with the Q output of the flip/flop 72 now high, the transistor driver Q12 is turned ON, thus causing the digital readout LED 100 to display the numeral 1. The digit 10 therefore is displayed on the channel display 24.

Correspondingly, as the count progresses, the digits 11, 12 and 13 are displayed on the channel display 24, in a progressive fashion. On the next count after the digit 13 is displayed, the BCD count actually corresponds to the count of 4, so that the C output now goes high. At this time, therefore, both Q and C are high, and the NAND gate 74 is enabled. Its output goes low, and upon being coupled to the flip-flop 74, resets it so that its Q output again goes low. The output of the NAND gate 76 goes high, and it resets the count of the decade counter 70. With the Q output low, the transistor driver Q12, and hence the digital readout LED 100, is turned OFF.

When the decade counter 70 is reset to zero, its actual output to the decoder/driver 68 corresponds to the BCD count of 1. Accordingly, normally the numeral or digit 1 would be displayed on the digital readout LED 101. However, in the illustrated embodiment, on the BCD count of 1, the television is turned OFF, so that this digit should not be shown. Therefore, on the BCD count of 1, the digital readout LED 101 is blanked, thus eliminating the digit from the display. This is accomplished by the NOR gates 41 and 42.

More particularly, when the decade counter 70 is reset, its B,C and D outputs all are low. The Q output of the flip-flop 72 also is low. All of the inputs of the NOR gate 41, therefore, are low at this time, and its output goes high. With this high coupled as an input to the NOR gate 42, its output goes low. This low is then coupled to the blanking input of the decoder/driver 68, to thus blank out its output to the digital readout LED 101. The high on the output of the NOR gate 41 also serves to turn OFF the television, as described more fully below.

Figure 7:
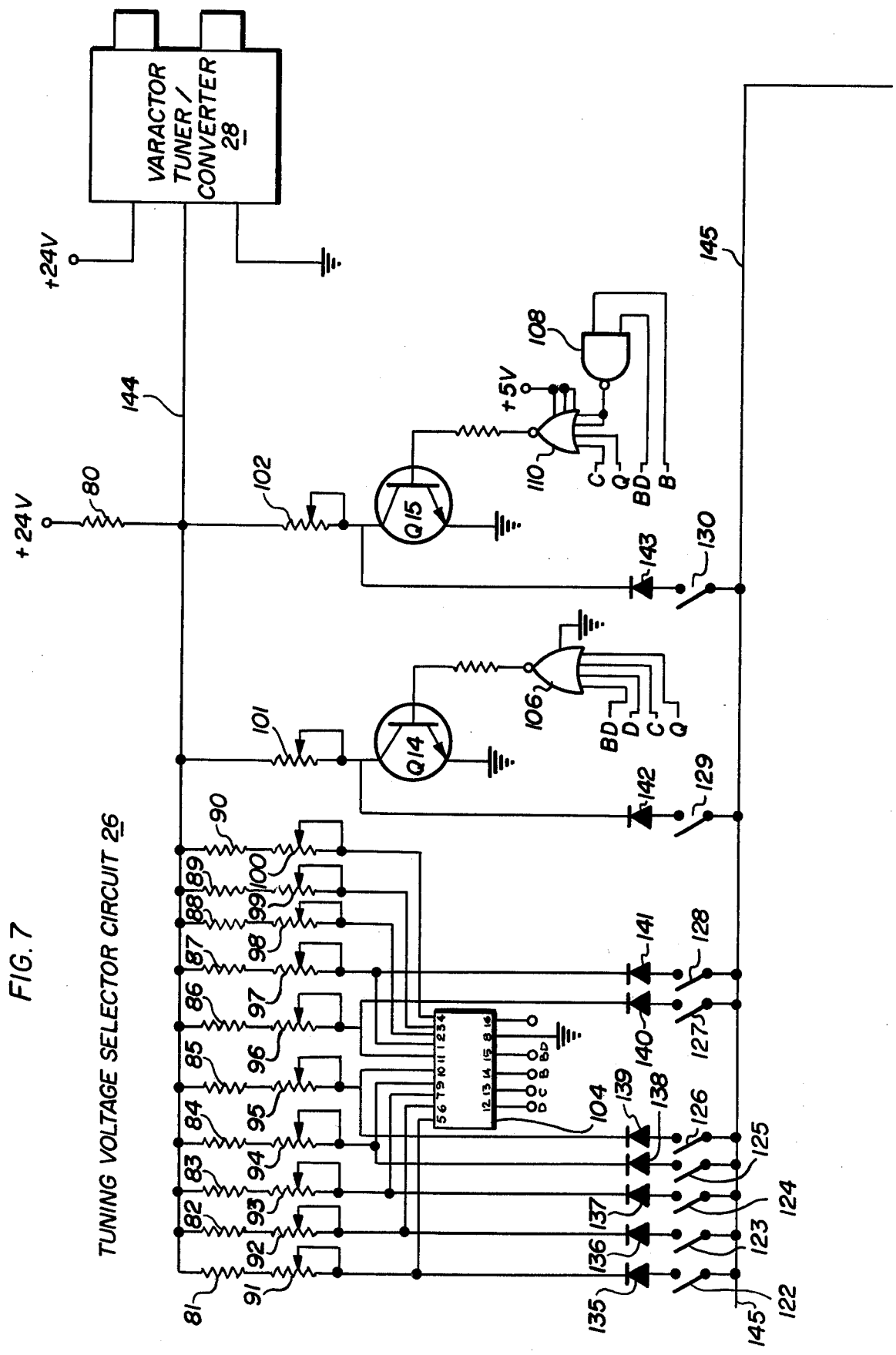

Tuning Voltage Selector Circuit 26 (FIG. 7)

The tuning voltage selector circuit 26, as can be seen in FIG. 7, includes fixed resistors 81-90, each of which has a potentiometer 91-100 associated with them, respectively, which are appropriately adjusted to, in conjunction with the resistor 80, to provide the proper tuning voltages to the varactor tuner/converter 28 to tune the latter to channels 4 through 13. In addition, a potentiometer 101 is provided which, in conjunction with the resistors 89, the potentiometer 99 and the resistor 80, provides the proper tuning voltage to tune the varactor/tuner converter 28 to channel 2, as more fully described below. Similarly, a potentiometer 102 is provided which, in conjunction with the resistor 90, the potentiometer 100 and the resistor 80, provides the proper tuning voltage to tune the varactor tuner/converter 28 to channel 3. In the illustrated embodiment, channels 4 through 13 are selected by the operation of the decoder/driver 104, while channels 2 and 3 are selected via the NOR gate 106 and via the NAND 108 and the NOR gate 110, respectively. NAND gates 112, 114 and 115 also are provided for detecting the selection of channels 11, 12 and 13, respectively. Program switches 118-130 are provided for automatically programming the channels to be selected, or skipped. Isolation diodes 131-143 are coupled with these program switches 118-130, respectively, for reasons which will be apparent from the description below.

More particularly, the decoder/driver 104 is a BCD to decimal decoder/driver and may be, for example, a type 7,445 decoder/driver of the type manufactured by Signetics, or its equivalent. The B, C, D and BD counts of the decade counter 70 are coupled to the inputs of the decoder/driver 104 and are decoded by the latter to select the respective ones of the channels 4 through 13, by coupling the appropriate tuning voltages to the varactor tuner/converter 28. The BCD count coupled to the decoder/driver 104 corresponds to the BCD count coupled to the decoder/driver 68 and, in the illustrated embodiment, channels 4 through 13 are selectively selected as the BCD count progresses.

Since, as indicated above, a BCD count corresponding to a count of 1 is an OFF position, and further, since the decoder/driver 104 is only capable of selecting 10 channels, channels 2 and 3 are selected by means of the NOR gate 106 and by means of the NAND gate 108 and the NOR gate 110, respectively, in conjunction with the resistor 80 and the resistors 89 and 90 and the potentiometers 99 and 100. Further still, since the BCD count is limited to a count from zero to 9, the BCD count corresponding to or utilized to select channels 2 and 3, also are utilized to select channels 12 and 13.

More specifically, when the BCD count coupled to the decoder/driver 104 corresponds to the counts 4 through 13, the respective ones of the channels 4 through 13 are selected, by means of the decoder/driver 104 coupling ground to the lower end (as illustrated) of the associated potentiometers 91-100. For example, assume that channel 4 is the selected channel, the decoder/driver 104 functions to couple ground to the lower end ot the potentiometer 91, thus causing current to flow from the +24 volt supply through the resistor 80, the resistor 81 and the potentiometer 91. In doing so, the proper tuning voltages is coupled to the varactor tuner/converter 28, via the conductor 144, to tune the varactor tuner/converter 28 to channel 4. Correspondingly, if the selected channel is channel 9, ground is coupled to the lower end of the potentiometer 96 so that current flows through the resistor 80, the resistor 86 and the potentiometer 96. In this case, the proper tuning voltage to tune the varactor tuner/converter 28 is coupled to the latter, via the conductor 144.

On the BCD counts corresponding to the counts of 1 through 3, and the counts of 11 through 13, the same BCD count is utilized for the least significant digit, while the Q output of the flip-flop 72 is utilized to drive the transistor driver Q12 to indicate the tens digit. Therefore, in the illustrated arrangement, the decoder/driver 104 would be operated to select each of the channel 12 and 13 twice as the BCD count progresses. Accordingly, in the illustrated embodiment, the potentiometers 99 and 100 first are respectively tuned to provide the proper tuning voltages to the varactor tuner/converter 28 to tune the latter to channel 12 and 13.

On the BCD count corresponding to the count of 2, all of the inputs to the NOR gate 106 will be low, hence its output goes high. This high is coupled to the base of the transistor driver Q14, and turns it ON. When this transistor driver Q14 is ON, current is caused to flow from the +24 volt supply through the resistor 80, the potentiometer 101 and the transistor driver Q14 to ground. However, for the reasons set forth above, the decoder/driver 104 also is operated at this time to couple ground to the lower end of the potentiometer 99 associated with the selection of channel 12. Accordingly, at this time, the potentiometer 101 is effectively connected in parallel with the resistor 89 and potentiometer 99, and this parallel combination is in series with the resistor 80. Therefore, the potentiometer 101 now is adjusted to provide the proper tuning voltage to the varactor tuner/converter 28, via the conductor 144, to tune the varactor tuner/converter 28 to channel 2.

Similarly, when the BCD count corresponds to the count of 3, the B and BD inputs to the NAND gate 108 both are high so that its output to the NOR gate 110 is low. At this time, the C and Q inputs to the NOR gate 110 also are low so that its output to the base of the transistor driver Q15 is high, turning the transistor driver Q15 ON. When transistor driver Q15 is ON, the potentiometer 102 is in parallel with the resistor 90 and the potentiometer 100 associated with channel 13, and the potentiometer 102 thus is adjusted to couple the proper tuning voltage to the varactor tuner 28 to tune it to channel 3.

When the respective ones of the channels 2, 3 and 4 through 10 are selected, the ground coupled to the cathodes of the respective ones of the isolation diodes 135-142 causes the signal on the conductor 145 connected to the base of the transistor Q11 to go low, thus turning on transistor Q11, as described above. When the transistor Q11 turns ON, the operation of the sequencing circuit 22 in selecting another channel is inhibited, as will be more fully described below.

Again, since the same BCD counts are used to select channels 11, 12 and 13, as are used to select channels 1, 2 and 3, with channel 1 actually being in the OFF position, the NAND gates 112, 114 and 116 are provided for detecting the selection of channels 11, 12 and 13, respectively. When all of the inputs to these respective gates go high, their outputs go low. These lows are coupled to the cathodes of the isolation diodes 131-133, respectively, and result in the transistor Q11 being turned ON, via the conductor 145, in the same manner as described above.

The program selector switches 118-130 permit the various ones of the channels to be programmed for selection, or to be automatically skipped. The program selector switches associated with the channels to be programmed for selection are closed, while those associated with channels to be skipped are left open. The open program selection switches prevent the signal on the conductor 145 from going low, so that the transistor Q11 is not turned ON.

The varactor tuner/converter 28, in the illustrated embodiment, is a commercially available varactor tuner/converter manufactured and sold by Standard Kollsman, Model No. 34P-065-002 or No. 34P-065-003. A varactor tuner/converter of this type is tuned to a specific channel by coupling the proper tuning voltage to it, and is further operable to convert the selected channel frequency to the channel frequency corresponding to channel 2, or channel 3, depending upon the particular varactor tuner/converter model utilized. In those areas wherein channel 2 is an unused channel, a tuner/converter which is operable to convert the output frequency to the frequency corresponding to channel 2 is utilized. In those areas where channel 3 is unused, a tuner/converter providing an output frequency corresponding to the frequency of channel 3 is utilized.

The output of the varactor tuner/converter 28, as indicated above, is coupled to the VHF input terminals of the television. Accordingly, with the television's normally provided tuner tuned to the corresponding unused channel, the output of the varactor tuner/converter 28 functions to operate the tuner to provide a video display.

While it is preferred to use a varactor tuner/converter of the described type, it is apparent that a conventional, commercially available varactor tuner can be used, together with a separate frequency converter which is operable to convert the output frequency of the varactor tuner to a frequency corresponding to an unused channel.

Power Supply and ON/OFF Control Circuit 30 (Fig. 4A)

As indicated above, the power cord 42 of the control unit 12 is plugged into any conventional 110-volt outlet, with the 110-volt AC supply being coupled to a transformer T100. The transformer T100 has two secondary windings having full wave rectifiers 146 and 147 coupled to them, respectively. The rectified secondary voltage is coupled through filtering networks to provide a 5-volt power source 32 and a 24-volt power source 34, for energizing the various components of the control unit.

The 110-volt source also is coupled to the receptacle 40, and as indicated above, the power cord for the television with which the remote control system is associated is plugged into the receptacle 40. A Triac 154 is included within the coupling, and its conduction is controlled by an optical coupler OC100 to turn the television ON and OFF, as more fully described below. The optical coupler OC100 also provides isolation between the AC voltage coupled to the television to energize it and the control unit 12. The conduction of the optical coupler OC100 is, in turn, controlled by the transistors Q16 and Q17, with the optical coupler OC100 being energized to trigger the Triac 154 conductive when the transistor Q3 is turned ON. Accordingly, when transistor Q16 is conductive, the optical coupler OC100 and the Triac 154 both are conductive, and AC power is supplied to the television to energize it.

As more fully described above, the sequence position corresponding to channel 1 is designated as the OFF position, and when the sequencing circuit 22 drives the decade counter 70 so that its output count corresponds to channel 1, the transistor Q17 is turned ON and, in turn, turns transistor Q16 OFF to disconnect the AC power from the television.

More particularly, the output of the NOR gate 41 is coupled to the base of transistor Q17. When all of the inputs to the NOR gate 41 are low, its output goes high and turns ON transistor Q17. As indicated above, in the illustrated embodiment, this occurs when the BCD count corresponds to the count of 1. When transistor Q17 turns ON, it turns OFF transistor Q16, thus disabling the optical coupler OC100 which, in turn, disables the Triac 154 and cuts off the AC power supply to the television. Power again is restored when the count of the decade counter 70 is advanced, as a result of the hand control 10 or the program selection push button switch 38 being operated.

Detail Description of Operation

Now that the operation of the various components of the remote control system has been generally described, the overall operation of the system can be described as follows. Initially, the control unit 12 is coupled with the television, as described above, and the control unit 12 is energized by plugging it into any conventional 110 volt AC outlet. The television's power switch is turned ON, and is left in this position. Its tuner also is tuned to an unused channel such as channel 2 or channel 3. The channels to be programmed for selection are selected by closing the appropriate ones of the program selection switches 118-130.

Assuming that the television initially is OFF, upon operating the push button switch 16 on the hand control 10, the transmitter 18 is energized and outputs a 40 KHz sonic signal. This signal is received by the receiver 20 of the control unit 12, amplified and coupled to the tone decoder 50 in the sequencing circuit 22. The tone decoder 50, upon detecting the 40KHz signal, couples ground on the conductor 60 to the base of the transistor switch Q5, thus turning it OFF.

When the transistor switch Q5 turns OFF, ground is removed from the junction 64, to the input of the timer 52, thus permitting it to operate to produce clock pulses on its output lead 62. These clock pulses are coupled to the decade counter 70 of the channel display 24. The first clock pulses causes the BCD count output of the decade counter 70 to advance to a BCD count of 2, for the reasons explained above. The B output of the decade counter 70 therefore goes high, and this B output being coupled to the input of the NOR gate 41 causes the latter' output now to go low, thereby turning OFF the transistor Q17. When transistor Q17 turns OFF, the transistor Q16 turns ON and, in turn, enables the optical coupler OC100 and the Triac 154, to thereby couple AC power to the television.

At the same time, the BCD count output of the decade counter 70 is coupled to the decoder driver 68 which drives the digital readout LED101 so that the latter displays the digit 2, and to the decoder/driver 104 of the tuning voltage selector circuit 26 which operates to couple ground to the lower end of the potentiometer 99 associated with the selection of channel 12, in the manner described above. Also, at this time, all of the inputs to the NOR gate 106 are low, so that the output of the NOR gate 106 goes high, thus turning ON transistor Q14. When transistor Q14 turns ON, ground is coupled to the lower end of the potentiometer 102, so that at this time the potentiometer 102 is connected in parallel with the resistor 89 and the potentiometer 99. The current flow through the resistor 80 and this parallel combination of resistances causes the proper tuning voltage to tune the varactor tuner/converter 28 to be tuned to channel 2 to be coupled via the conductor 144 to the varactor tuner/converter 28. Its output frequency is converted to the frequency of the unused channel to which the television's tuner is tuned, hence channel 2 is displayed on the television.

When transistor Q14 turns ON, ground also is coupled to the cathode of the isolation diode 142 and, since the program selector switch 129 is closed, the signal on the conductor 145 to the base of the transistor Q11 of the sequencing circuit 22 goes low, thus turning ON transistor Q11.

When transistor Q11 turns ON, the J and K inputs of the flip-flop 58 both go high and, depending upon the output state of the flip-flop 58 at this time, one or the other of the Q and $\overline{Q}$ outputs goes high, when the flip-flop 58 is clocked by the transistor Q10. The output of the latter, as explained above, is delayed by the capacitor C8 to permit a channel to be selected and for the transistor Q11 to be turned ON, before clocking the flip-flop 58.

Assume that the Q output of the flip-flop 58 goes high at this time, and that its $\overline{Q}$ output goes low. When the $\overline{Q}$ output goes low, the transistor Q8 of the time delay transistor switch 56 immediately turns OFF, and the transistor Q9 turns ON. When transistor Q9 turns ON, ground is coupled to the junction 64 and, hence, to the timer 52, thus stopping the timer 52.

The time delay switch 56 provides a delay of approximately one second, before transistor Q8 again is turned ON and the transistor Q9 is turned OFF, removing the ground at the junction 64 which inhibits the timer 52 from further outputting any clock pulses. Accordingly, there is a pause of approximately one second on the selected channel. If during this one second pause, no further signals are detected by the tone decoder 50, the signal on its output lead 60 to the base of the transistor switch Q5 again goes high, and the transistor switch Q5 is again turned ON. When the transistor switch Q5 turns ON, ground is coupled to the junction 64 and hence to the timer 52. The timer 52, therefore, is inhibited from providing any additional clock pulses, and no further sequencing occurs, with the television being tuned to channel 2, the selected channel.

It is apparent that the same above-described operation would have occurred, if the channel selector push button 38 would have been manually operated to close it to couple ground to the base of the transistor switch Q5, to turn the transistor switch Q5 OFF.

Also, had the television already been ON and tuned to a channel, the television would be tuned to the next subsequent one of the programmed channels, as a result of the push button switch 16 of the hand control 10 or the channel selector push button 38 being operated.

If during the above-described operation in selecting and tuning channel 2, the push button switch 16 of the hand control 10 or the channel selector push button 38 had been continuously operated, the transistor switch Q5 would remain OFF. Accordingly, after the pause of approximately one second provided by the time delay switch 56, the transistor Q8 would turn ON and the transistor Q9 would turn OFF, thus removing the ground coupled to the junction 64 and, hence, the timer 52. With no ground at this time, the timer 52 again would output a clock pulse to the decade counter 70, and the BCD count would advance by one, thus causing the next programmed channel to be selected. When the channel is selected, the signal on the conductor 145 to the base of transistor Q11 again goes low, turning on the transistor Q11. When transistor Q11 turns ON, the inputs J and K of the flip-flop 58 again are high. When the flip-flop 58 is clocked by the transistor Q10, the Q output now will be low and the $\overline{Q}$ output high. At this time, the transistor Q6 of the time delay switch 54 immediately turns OFF, and the transistor Q7 turns ON, thus coupling ground to the junction 64 and hence the timer 52 to inhibit its output. Again, a pause of approximately one second is provided on this selected channel and, if at the end of the pause, the push button switch 16 or the channel selector push button 38 is still operated, the sequencing circuit 22 operates to step to the next programmed channel.

As the BCD count of the decade counter 70 progresses, the respective ones of the channels 2 through 13 are sequentially selected, if the program selector switches 118–130 are closed. On the BCD counts of 2 and 3, the respective channels 2 and 3 are selected, by the operation of both the decoder/driver 104 and the NOR gate 106 and the NAND gate 108 and the NOR gate 110, in the manner previously described. When the BCD count progresses from the count of 2 to the count of 8, its D output to the flip-flop 72 of the channel display 24 goes high. As the BCD count then progresses from the count of 8 to the count of 9 and then to 0, its D output again goes low and the flip-flop 72 is clocked so that its Q output goes high. At this time, the digital readout LED 101 displays the digit 0, and the transistor driver Q12 is turned ON, thus causing the digital readout LED 100 to display the digit 1, so that the composite digit 10 is displayed. On the subsequent counts, the composite digits 11, 12 and 13 are displayed in a corresponding fashion. Also, the selection of channels 11, 12 and 13 are detected by the NAND gates 112, 113 and 114, respectively, to turn ON transistor Q11, as described above. Channels 12 and 13 are selected by the operation of the decoder/driver 104, without the transistors Q14 and Q15 being turned ON, so that the proper tuning voltages are provided by the resistor 80 and the resistor 88 and the potentiometer 98, and the resistor 90 and the potentiometer 100, respectively.

When the BCD count progresses to 4, the NAND gate 74 is enabled since both of its inputs now are high. Its output therefore goes low, and clears or resets the flip-flop 72 so that its Q output again goes low. Simultaneously, the NAND gate 76 is enabled such that its output goes high, thus resetting the count of the decade counter 70.

When the count of the decade counter 70 is reset, the BCD count actually coupled to the decoder/driver 68 corresponds to a count of 1, for reasons explained above. At this time, the Q output of the flip-flop 72 is low, as are the B, C and D outputs of the decade counter 70. Accordingly, it may be noted that all of the inputs to the NOR gate 41 now are low, and the output of the NOR gate 41 therefore goes high. This high is coupled to the base of transistor Q17 and turns it ON. When transistor Q17 turns ON, the transistor Q16 turns OFF and, in turn, disables the optical coupler OC100 and the Triac 154. The AC power is thus cut off to the television, turning the latter OFF.

The high at the output of the NOR gate 41 also is coupled to the input of the NOR gate 42, so that its output now goes low. This low is coupled to the blanking input of the decoder/driver 68 to blank its output so that the digital readout LED 101 is extinguished and the digit 1 is not displayed. In this fashion, the count is not lost so that upon receipt of the next clock pulse from the timer 52, the BCD count of the decade counter 70 will advance to the count of 2, thus again turning ON the television and selecting channel 2. The low output of the NOR gate 42 also is coupled to the cathode of the isolation diode 134, hence the signal on the conductor 145 to the base of transistor Q11 goes low. The transistor Q11 turns ON, and a pause of approximately one second again is provided, as described above, before the television can be again turned ON.

It will thus be seen that the objects set forth above, among those made apparent from the preceding description, are efficiently attained and certain changes may be made in carrying out the above method and in the construction set forth. Accordingly, it is intended that all matter contained in the above description or shown in the accompanying drawings shall be interpreted as illustrative and not in a limiting sense.

Now that the invention has been described, what is claimed as new and desired to be secured by Letters Patent is:

1. Apparatus adapted to be retro-fitted to a television for electronically controlling the selecting of channels and the ON/OFF functions thereof, the television including a tuner, the television's tuner being tuned to a predetermined unused channel and the television being turned ON, comprising, in combination:
    a hand control comprising transmitter means operable to transmit a sonic signal;
    a control unit comprising:
    a varactor tuner;
    converter means coupled to said varactor tuner for converting the output signals thereof to signals having the frequency corresponding to the frequency of the unused channel to which the television tuner is tuned, said signals having the frequency to which the television tuner is tuned being coupled to the television tuner;
    channel display means operated to provide an indication of the channel to which said varactor turner is tuned;
    receiver means responsive to said sonic signals transmitted by said transmitter means;
    circuit means comprising a tuning voltage selector circuit for selectively coupling tuning voltages to said varactor tuner to tune the same to the respective ones of said plurality of different channels, and a sequencing circuit operated responsive to the receipt by said receiver means of said sonic signals transmitted by said transmitter means for controlling the operation of said tuning voltage selector circuit to sequentially selectively couple the tuning voltages to said varactor tuner to progressively tune said varactor tuner to each of said plurality of different channels in a step-by-step fashion;
    said sequencing circuit further comprising time delay means operated each time said varactor tuner is tuned to one of said plurality of different channels to inhibit further operation of said sequencing circuit for a pre-established time interval whereby a pause is provided after the varactor tuner is tuned to a channel before the varactor tuner is tuned to the next channel; and
    a manually operable channel selector switch means for operating said circuit means, whereby the television can be both remotely and manually selectively tuned to a channel by operating the transmitter means and the channel selector switch means.

2. The apparatus of claim 1, wherein said control unit further comprises power supply control means for controlling the power supply coupled to said television to turn it ON and OFF, one of said plurality of different channels being designated an OFF position, detecting means for detecting when said varactor tuner is tuned to said one channel and for operating said power supply control means to cut off the power supply to said television to turn OFF said television.

3. The apparatus of claim 2, wherein said control unit further comprises program selection switch means coupled with said tuning voltage circuit means and said sequencing circuit, said program selection switch means being manually operable to program the various ones of said plurality of different channels for selection and operating said tuning voltage circuit means and said sequencing circuit means to skip channels which are not programmed for selection.

4. The apparatus of claim 3, wherein said channel display means comprises digital readout means for providing a digital indication of the channel to which said varactor tuner is tuned, and driver means under the control of said sequencing circuit for operating said digital readout means.

5. The apparatus of claim 1, wherein said circuit means further comprises counter means operative to count clock pulses coupled to it and to provide BCD (binary coded decimal) output pulses, said tuning voltage selector circuit comprising decoder means responsive to said BCD output pulses for selectively coupling said tuning voltages to said varactor tuner, said sequencing circuit comprising timer means for generating clock pulses, a first transistor switch for controlling the operation of said timer means, tone detector means operable to detect the receipt by said receiver means of said sonic signals transmitted by said transmitter means for controlling the operation of said first transistor switch, said tone detector means upon being operated operating said first transistor switch and said first transistor switch operating said timer means to provide said clock pulses to said counter means, said counter means providing said BCD output pulses to said decoder means and said decoder means being operated to selectively couple said tuning voltages to said varactor tuner to tune it to a channel in accordance with said BCD output pulses coupled to said decoder means.

6. The apparatus of claim 5, wherein said sequencing circuit further comprises time delay means coupled to said timer means for inhibiting the operation of said timer means for a pre-established time interval, and means operated when said varactor tuner is tuned to a channel for operating said time delay means, whereby each time the varactor tuner is tuned to a channel the timer means is inhibited to thus prevent the varactor tuner from being tuned to another channel so that there is a pre-established pause as the varactor tuner is tuned from one channel to another.

7. The apparatus of claim 5, wherein said circuit means further comprises a plurality of channel selector switches, each of which is associated with one of said plurality of different channels and is included in the coupling between tuning voltage selector circuit and said means operated when said varactor tuner is tuned to a channel, the respective ones of said channels being programmed for selection by closing the associated one of said channel selector switches to permit a signal to be coupled to said means when said varactor tuner is tuned to that channel.

8. The apparatus of claim 5, wherein said control unit further comprises power supply control means for supplying AC power to said television, said power supply control means comprising a receptacle for receiving the AC power cord for said television to couple AC power from said control unit to said television, electronic switch means included in said coupling, gating means coupled to said electronic switch means, one of said plurality of different channels being designated as an OFF position and the BCD output pulses of said counter means corresponding to said one channel being coupled to and operating said gating means, said gating means upon being operated operating said electronic switch means to cut off the AC power to said television to thereby turn OFF said television.

9. The apparatus of claim 5, wherein said channel display comprises digital readout means for providing a digital indication of the channel to which said varactor tuner is tuned, said digital readout means comprising seven segment readouts, decoder/driver means for driving said seven segment readouts, the BCD outputs pulses of said counter being coupled to and operating said decoder/driver means to provide said digital indications.

10. The apparatus of claim 9, werein said digital readout means comprises a pair of seven segment readouts, one of said seven segment readouts being operated by said decoder/driver means in accordance with said BCD output pulses to provide the digits 0 through 9, a transistor driver for operating the other one of said seven segment readouts to provide the digit 1, and means operated and controlled by said counter means in accordance with said BCD output pulses to operate said transistor dirver.

* * * * *